(12) United States Patent
Schultz (10) Patent No.: US 8,596,123 B2
(45) Date of Patent: *Dec. 3, 2013

(54) MEMS DEVICE WITH IMPACTING STRUCTURE FOR ENHANCED RESISTANCE TO STICTION

(75) Inventor: Peter S. Schultz, Gilbert, AZ (US)

(73) Assignee: Freescale Semiconductor, Inc., Austin, TX (US)

(*) Notice: Subject to any disclaimer, the term of this patent is extended or adjusted under 35 U.S.C. 154(b) by 278 days.

This patent is subject to a terminal disclaimer.

(21) Appl. No.: 13/101,793

(22) Filed: May 5, 2011

(65) Prior Publication Data

US 2012/0280591 A1    Nov. 8, 2012

(51) Int. Cl.
    *G01P 15/125*    (2006.01)
(52) U.S. Cl.
    USPC .................................... 73/514.32; 73/514.38
(58) Field of Classification Search
    USPC .............. 73/514.32, 514.36, 514.38, 514.29
    See application file for complete search history.

(56) References Cited

U.S. PATENT DOCUMENTS

| | | | |
|---|---|---|---|
| 6,029,517 A * | 2/2000 | Brun et al. ................. | 73/514.38 |
| 6,336,658 B1 * | 1/2002 | Itoigawa et al. ............. | 280/735 |
| 6,360,605 B1 * | 3/2002 | Pinter et al. ................. | 73/514.38 |
| 6,568,269 B2 * | 5/2003 | Nakabayashi ............. | 73/514.32 |
| 6,634,232 B1 * | 10/2003 | Rettig et al. ................ | 73/514.15 |
| 6,955,086 B2 * | 10/2005 | Yoshikawa et al. ........ | 73/514.32 |
| 7,554,711 B2 | 6/2009 | Miles | |
| 7,578,190 B2 * | 8/2009 | Lin et al. .................... | 73/514.29 |
| 8,079,262 B2 * | 12/2011 | Guo .......................... | 73/514.32 |
| 2004/0129077 A1 * | 7/2004 | Franz et al. ................ | 73/514.14 |
| 2010/0128337 A1 | 5/2010 | Tung | |
| 2010/0186508 A1 * | 7/2010 | Guenther et al. .......... | 73/504.14 |
| 2012/0216616 A1 * | 8/2012 | Schultz ...................... | 73/514.38 |
| 2012/0297879 A1 * | 11/2012 | Ullrich et al. .............. | 73/514.32 |

* cited by examiner

*Primary Examiner* — Helen Kwok
(74) *Attorney, Agent, or Firm* — Schmeiser, Olsen & Watts LLP; Lowell W. Gresham; Charlene R. Jacobsen (57) ABSTRACT

A microelectromechanical systems (MEMS) device (20) includes a substrate (24) and a movable element (22) adapted for motion relative to the substrate (24). A secondary structure (58) extends from the movable element (22). The secondary structure (58) includes a secondary mass (70) and a spring (68) interconnected between the movable element (22) and the mass (70). The spring (68) is sufficiently stiff to prevent movement of the mass (70) when the movable element (22) is subjected to force within a sensing range of the device (20). However, the spring (68) deflects when the device (20) is subjected to mechanical shock (86), and the spring (68) rebounds thus causing the mass (70) to impact the movable element (22) in a direction that would be likely to dislodge a potentially stuck movable element (22).

20 Claims, 5 Drawing Sheets

MEMS DEVICE WITH IMPACTING STRUCTURE FOR ENHANCED RESISTANCE TO STICTION

TECHNICAL FIELD OF THE INVENTION

The present invention relates generally to microelectromechanical systems (MEMS) devices. More specifically, the present invention relates to a MEMS device with an impacting mass structure for enhanced resistance to stiction and damage from mechanical shock.

BACKGROUND OF THE INVENTION

Microelectromechanical Systems (MEMS) devices are widely used in applications such as automotive, inertial guidance systems, household appliances, protection systems for a variety of devices, and many other industrial, scientific, and engineering systems. Such MEMS devices are used to sense a physical condition such as acceleration, pressure, or temperature, and to provide an electrical signal representative of the sensed physical condition.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION

Suspended movable microstructures such as plates and beams are commonly used in the manufacturing of various microelectromechanical systems (MEMS) MEMS devices. These suspended movable microstructures can be adversely affected during normal use by excessive external forces, such as mechanical shock. A mechanical or physical shock is a sudden acceleration or deceleration caused, for example, by impact, drop, kick, and so forth. This mechanical shock can cause severe reliability problems in the structure of a MEMS device.

The suspended microstructures of MEMS devices typically have relatively large surface areas with high stiffness. However, the suspension springs for such suspended microstructures may have relatively low stiffness depending upon the application. For example, some accelerometers are designed to include highly compliant (i.e., low stiffness) suspension springs so that the suspended microstructures will move a detectable amount under conditions of 1 g magnitude or less. In addition, the microstructures are fabricated a few microns off their supporting substrate. The combination of these characteristics makes MEMS devices susceptible to surface forces which can deflect the suspended movable microstructures vertically toward vertical motion stops and/or the supporting substrate. Additionally or alternatively, the suspended movable microstructures can deflect laterally toward surrounding structures or lateral motion stops. If the deflection force is sufficiently strong, the movable member can come into contact with and temporarily or permanently adhere to the underlying substrate or the lateral structures causing false output signals and/or device failure. This unintentional adhesion of a movable structure is referred to as stiction. Stiction can occur both during MEMS device fabrication and during normal use.

Embodiments disclosed herein entail microelectromechanical (MEMS) devices with enhanced resistance to stiction and damage when subjected to mechanical shock. In particular, embodiments entail a secondary structure extending from a suspended movable element. The secondary structure includes a spring element adapted for movement so that a secondary mass of the secondary structure will impact the movable element when the MEMS device is subjected to mechanical shock. The term "secondary structure" used herein refers to a projecting member coupled to the movable element. In addition, the term "impact" used herein refers to movement of the secondary structure relative to the suspended movable element such that the secondary structure forcefully strikes the movable element.

In general, when a large enough force (e.g., mechanical shock) is applied to the movable element, the movable element will move until it comes into contact with appropriately placed motion stops thus halting movement of the movable element. In such an event, a stiction event is possible in which the movable element adheres to the motion stops.

In accordance with embodiments described herein, the additional force beyond what is needed to cause a stiction event is used to push the secondary structure into a state ready for recoil and impact with the movable element in a direction that is likely to dislodge a potentially stuck movable element when the movable element is struck by the secondary. Furthermore, some of the energy from the mechanical shock may be absorbed by the spring element in order to limit or prevent breakage to internal structures of the MEMS device. Thus, a MEMS device that includes the secondary structure may be less likely to fail when subjected to mechanical shock, thereby enhancing long term device reliability.

Figure 1:
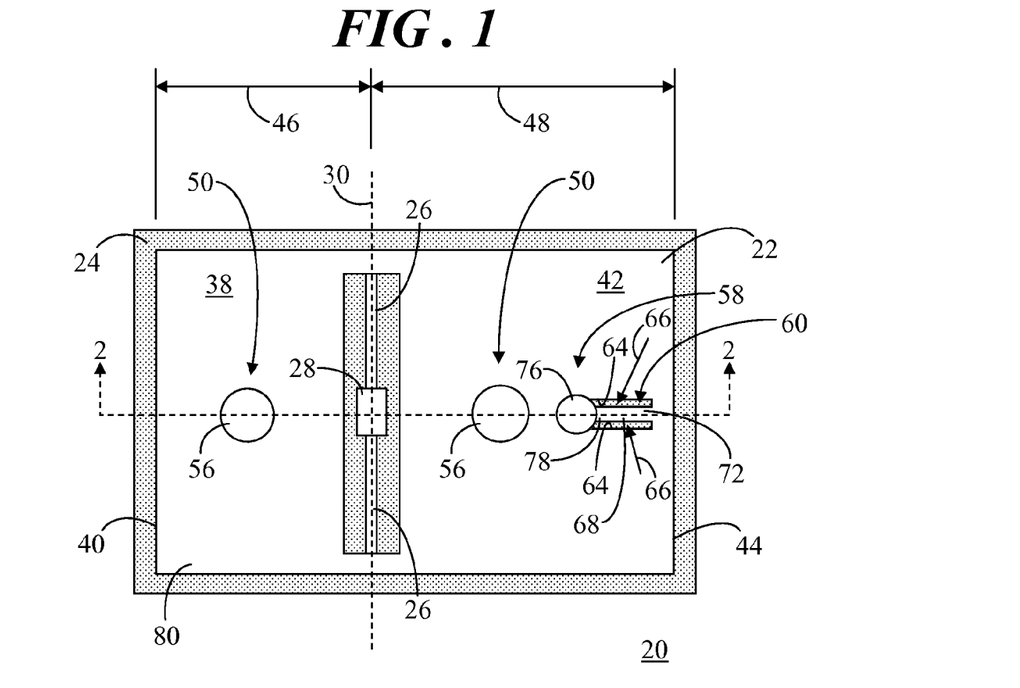
FIG. 1 shows a top view of a MEMS device in accordance with an embodiment.
Figure 2:
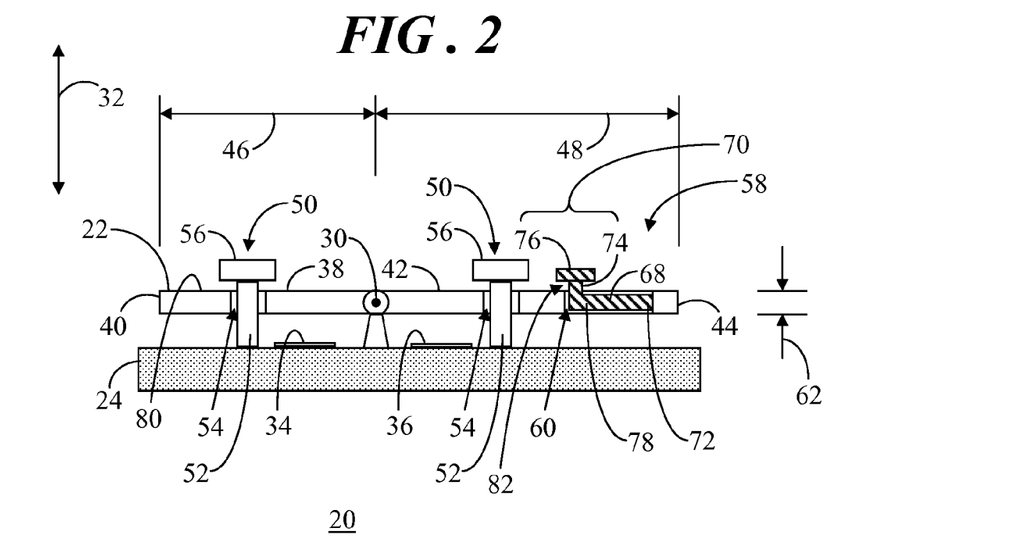
FIG. 2 shows a side view of the MEMS device of FIG. 1.

Referring to FIGS. 1 and 2, FIG. 1 shows a top view of a MEMS device 20 in accordance with an embodiment, and FIG. 2 shows a side view of MEMS device 20. In this example, MEMS device 20 is a two layer capacitive transducer having a "teeter-totter" or "see saw" configuration. MEMS device 20 includes a movable element or plate, referred to as a proof mass 22, suspended above a substrate 24. In an embodiment, proof mass 22 may be flexibly suspended above substrate 24 by one or more spring members, for example, rotational flexures 26 situated at elevated attachment points via an anchor 28 coupled to the underlying substrate 24.

Rotational flexures 26 enable rotation of proof mass 22 about a rotational axis 30 under z-axis acceleration, represented by an arrow 32, relative to substrate 24. The accelerometer structure of MEMS device 20 can measure two distinct capacitances between proof mass 22 and two sense plates 34 and 36 that are symmetrically located relative to rotational axis 30 in order to determine differential or relative capacitance. The side view of MEMS device 20 in FIG. 2 represents a condition in which proof mass 22 is in a neutral position, i.e., an initial position or a position that proof mass 22 returns to when it is not being subjected to a measurable z-axis acceleration 32.

Although only a single anchor 28 and a pair of rotational flexures 26 is shown, those skilled in the art will recognize that proof mass 22 may be flexibly suspended above substrate 24 by a different anchor and spring configuration than that which is shown. Additionally, the anchor and spring configuration need not be physically located on rotational axis 30. Instead, an alternative anchor and spring configuration may include multiple anchors and springs that are appropriately spaced to form a virtual rotational axis 30 between pairs of spring members. Furthermore, although the embodiments discussed herein pertain to accelerometer structures, it should be understood that the following discussion applies equivalently to other MEMS devices having movable parts that could be damaged when subjected to a mechanical shock.

Certain features within FIGS. 1 and 2 are illustrated using various shading and/or hatching to distinguish different elements of MEMS device 20. For example, substrate 24 is illustrated using light shading so that it is distinguishable through apertures or openings extending through proof mass 22. The different elements within MEMS device 20 may be produced utilizing current and upcoming surface micromachining techniques of deposition, patterning, etching, and so forth. Accordingly, although different shading and/or hatching may be utilized in the illustrations, the different elements within MEMS device may be formed out of the same material, such as polysilicon, single crystal silicon, and the like.

The elements of MEMS device 20 (discussed below) may be described variously as being "attached to," "attached with," "coupled to," "fixed to," or "interconnected with," other elements of MEMS device 20. However, it should be understood that the terms refer to the direct or indirect physical connections of particular elements of MEMS device 20 that occur during their formation through patterning and etching processes of MEMS fabrication.

Proof mass 22 includes a first section 38 between rotational axis 30 and a first end 40 of proof mass 22, and a second section 42 between rotational axis 30 and a second end 44 of proof mass 22. First section 38 exhibits a first length 46 between rotational axis 30 and first end 40. Likewise, second section 42 exhibits a second length 48 between rotational axis 30 and second end 44. In an embodiment, second length 48 is greater than first length 46. Thus, rotation can occur about rotational axis 30 in response to z-axis acceleration 32 because the weight of second section 42 is greater than the weight of first section 38. Thus, the second section 42 resembles the "heavy end" of a "teeter-totter" or "see saw" proof mass configuration.

The terms "first" and "second" used herein do not refer to an ordering or prioritization of elements within a countable series of elements. Rather, the terms "first," "second," and so forth are used herein to distinguish similar or related elements, such as the sections 38 and 42 of proof mass 22, the ends 40 and 44 of proof mass 22, the lengths 46 and 48 of proof mass 22, and so forth for clarity of discussion.

MEMS device 20 may include a number of vertical motion stops 50. In general, each vertical stop 50 includes a post unit 52 coupled to substrate 24 and passing through an opening 54 (best seen in FIG. 2) extending through in proof mass 22. In the illustrated embodiment, MEMS device 20 includes one of vertical stops 50 having post unit 52 directed through first section 38 of proof mass 22 and one of vertical stops 50 having post unit 52 directed through second section 42 of proof mass 22. Alternative embodiments may include more or less than the two vertical stops 50 shown. Each vertical stop 50 includes a cap 56 having a greater diameter than the diameter of opening 54.

A secondary structure 58 is coupled to proof mass 22 and is suspended above substrate 24. In the illustrated embodiment, proof mass 22 includes an aperture 60 extending through a thickness 62 of proof mass 22 and defined by inner side walls 64. Secondary structure 58 resides in aperture 60 and is spaced apart from inner side walls 64 of proof mass 22 by a gap 66. Although secondary structure 58 is visible in both of FIGS. 1 and 2, secondary structure 58 is expressly represented in FIG. 2 (as well as in FIGS. 3-6) by rightwardly and downwardly directed wide hatching.

Secondary structure 58 includes a spring element 68 and a secondary mass 70. Spring element 68 is positioned in aperture 60, and a first end 72 of spring element 68 is coupled to, i.e. formed to extend from, one of inner side walls 64 of proof mass 22. Secondary mass 70 includes a stem 74 (visible in FIG. 2) and a cap 76. Stem 74 is coupled, i.e. formed to extend from, to a second end 78 of spring element 68 and resides in aperture 60. Stem 74 is oriented approximately perpendicular to a surface 80 of proof mass 22. Cap 76 is coupled to stem 74 and resides above surface 80 of proof mass 22 such that a portion of cap 76 overlies surface 80 to yield a gap 82 between surface 80 of proof mass 22 and cap 76.

As will be discussed in greater detail below, the spring members, i.e., rotational flexures 26, that suspend proof mass 22 above substrate 24, are configured to undergo a first deflection amount in response to a unit of force, e.g., z-axis acceleration 32, so that proof mass 22 rotates about axis of rotation 30 in response to z-axis acceleration. Additionally, spring 68 is configured to undergo a second deflection amount in response to the same unit of force, e.g., z-axis acceleration 32. In an embodiment, the second deflection amount of spring 68 is less than the first deflection amount of rotational flexures 26.

In an embodiment, the magnitude/amount of deflection in response to a unit of force that each of spring 68 and rotational flexures 26 are capable of can be at least partially established by the spring stiffness of each of rotational flexures 26 and spring 68. For example, spring 68 may be configured to have a spring stiffness that is greater than a collective spring stiffness of the spring members, i.e., rotational flexures 26, that suspend proof mass 22 above substrate 24. In an exemplary embodiment, the spring stiffness of spring 68 may be at least one order of magnitude (i.e., about ten times) greater than a collective spring stiffness of rotational flexures 26. The stiffness of a spring is generally a measure of its resistance to deformation. Thus, a stiffer spring requires greater force to deform it than a spring that is more compliant, i.e., less stiff.

It should be understood that the spring stiffness needed for spring 68 in an embodiment is additionally related to the mass (i.e., weight) of stem 74 and cap 76 of secondary mass 70 relative to the mass (i.e., weight of proof mass 22). In other words, the spring stiffness needed for spring 68 is related to how much mass (i.e. weight) spring 68 is supporting. It is the combination of the spring stiffness and the weight of a particular mass that rotational flexures 26 or spring 68 is supporting that determines how much the spring will deflect, i.e., a deflection amount, in response to a unit of force.

In an embodiment, the collective spring stiffness of rotational flexures 26 in concert with the weight of proof mass 22, enables flexures 26 to twist in response to z-axis acceleration 32 within a particular sensing range, for example, between 0 and 8 g's, so that proof mass 22 rotates about rotational axis 30 at accelerations within the sensing range.

However, due to its greater stiffness in concert with the weight of secondary mass 70, spring 68 is prevented from deflecting appreciably, i.e., twisting or bending, within the particular sensing range of MEMS device 20. Instead, spring 68 must be subjected to a significantly greater force, e.g., mechanical shock, at levels of hundreds or thousands of g's before it will deflect appreciably. The operation of MEMS device 20, and particularly with respect to secondary structure 58, will be described in connection with the ensuing discussion of FIGS. 3-6.

Figure 3:
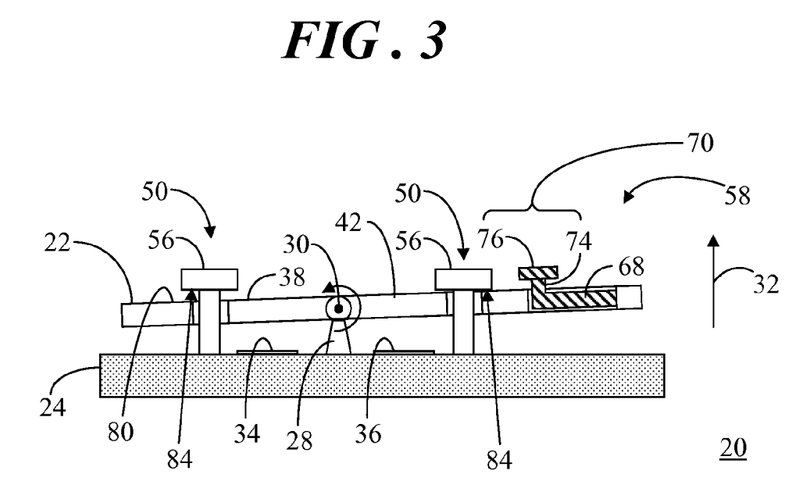
FIG. 3 shows a side view of the MEMS device of FIG. 1 subjected to a force greater than a predetermined sensing range for the MEMS device.

FIG. 3 shows a side view of the MEMS device 20 subjected to a force, i.e., z-axis acceleration 32, greater than a predetermined sensing range for MEMS device 20. When MEMS device 20 is subjected to z-axis acceleration 32, proof mass 22 will rotate about rotational axis 30. In the example presented in FIGS. 3-6, proof mass 22 rotates such that second section 42 of proof mass 22 moves upwardly, while first section 38 of proof mass 22 moves downwardly. It should be readily apparent however, that z-axis acceleration 32 may be directed opposite to that which is shown. Accordingly, proof mass 22 would rotate in the opposite direction.

The predetermined sensing range for a MEMS device, such as MEMS device 20, is typically much less than the motion range for proof mass 22. Thus, under conditions of z-axis acceleration 32 that are greater than the predetermined sensing range, surface 80 of proof mass 22 may momentarily contact a bottom surface 84 of one or more caps 56 of vertical motion stops 50 as proof mass 22 rotates about rotational axis 30. Proof mass 22 will subsequently return to its neutral position, shown in FIG. 2, following application of z-axis acceleration 32. Vertical stops 50 can limit movement of proof mass 22 under greater than normal z-axis acceleration 32 so that proof mass 22 is less likely to become damaged. However, spring 68 of secondary structure 58 is prevented from deflecting appreciably, i.e., twisting or bending, when z-axis acceleration 32 is within or near the predetermined sensing range for MEMS device 20. Accordingly, secondary structure 58 that includes secondary mass 70 having cap 76 and spring 68 does not change or affect the normal operation of MEMS device 20 under relatively low z-axis acceleration 32.

Figure 4:
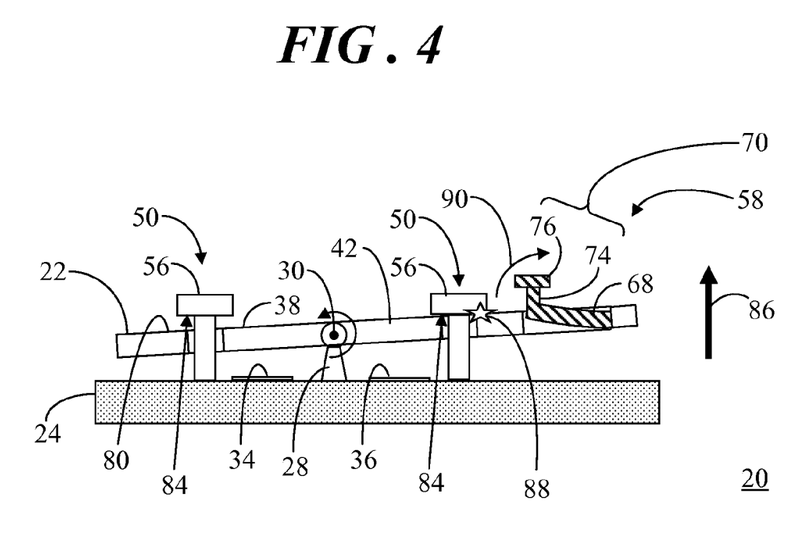
FIG. 4 shows a side view of the MEMS device subjected to mechanical shock.

FIG. 4 shows a side view of MEMS device 20 subjected to a mechanical shock 86, represented by a heavy arrow. Mechanical shock 86 is a z-axis acceleration 32 (FIG. 2) that is considerably greater than the sensing range of MEMS device 20. For example, mechanical shock 86 may be orders of magnitude greater than the sensing range of MEMS device 20. When subjected to mechanical shock 86, proof mass 22 will again rotate about rotational axis 30 until surface 80 of proof mass 22 forcefully collides with bottom surface 84 of one or more caps 56 of vertical motion stops 50. In the example presented in FIG. 4, the collision of proof mass 22 against bottom surface 84 of one of caps 56 is represented by a star element 88. That is, star element 88 is not a physical component of MEMS device 20, but rather star element 88 is used to represent a forceful contact or collision of proof mass 22 with motion stops 50 that could potentially cause physical damage to MEMS device 20.

Mechanical shock 86 applied to proof mass 22 is strong enough to use up the range of motion of proof mass 22 such that proof mass 22 stops against bottom surface 84 of one or more caps 56. When a conventional MEMS device that does not include secondary structure 58 is subjected to, for example, mechanical shock 86, any additional force from mechanical shock 86 placed against caps 56 from proof mass 22 can result in a stiction event in which proof mass 22 is temporarily or permanently adhered to caps 56, or alternatively, caps 56 may break or shear off. With the inclusion of secondary structure 58 in MEMS device 20, the additional force from mechanical shock 86 beyond what is needed to push proof mass 22 against caps 56 of vertical motion stops 50 is instead used to push secondary mass 70 into a state ready for recoil. That is, as shown in FIG. 4, spring 68 flexes, twists, or bends, as represented by a clockwise curved arrow 90 such that cap 76 springs upwardly away from surface 80 of proof mass 22.

Figure 5:
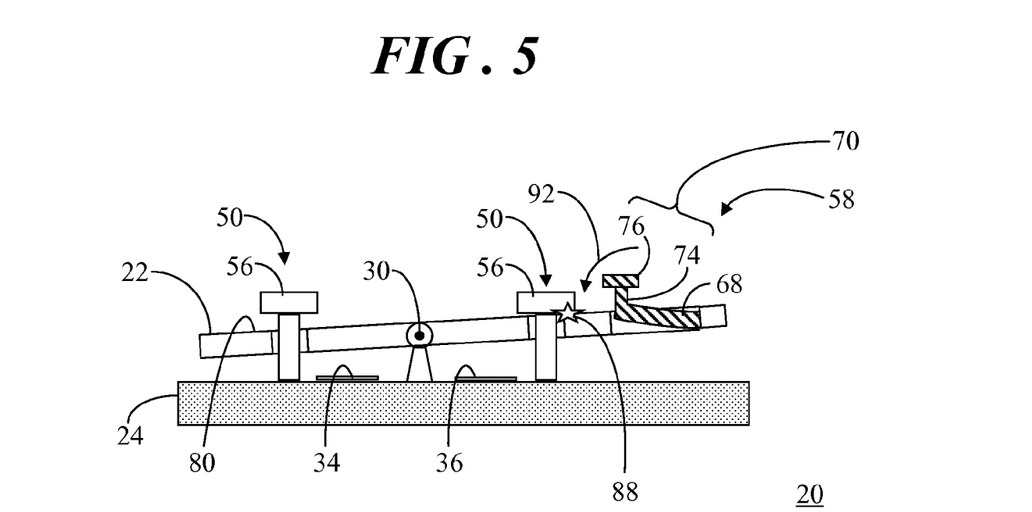
FIG. 5 shows a side view of the MEMS device in which a secondary structure rebounds in response to the mechanical shock.

FIG. 5 shows a side view of MEMS device 20 in which secondary structure 58 rebounds in response to mechanical shock 86 (FIG. 4) and the resulting collision of proof mass 22 with cap 56 of vertical motion stop 50. The condition illustrated in FIG. 5 approximately instantaneously follows the condition illustrated in FIG. 4 and is a direct response to the condition illustrated in FIG. 4. As represented in FIG. 5, spring 68 has used up its range of motion and springs back, i.e., rebounds, in the opposite direction relative to its initial movement as represented by a counterclockwise curved arrow 92.

Figure 6:
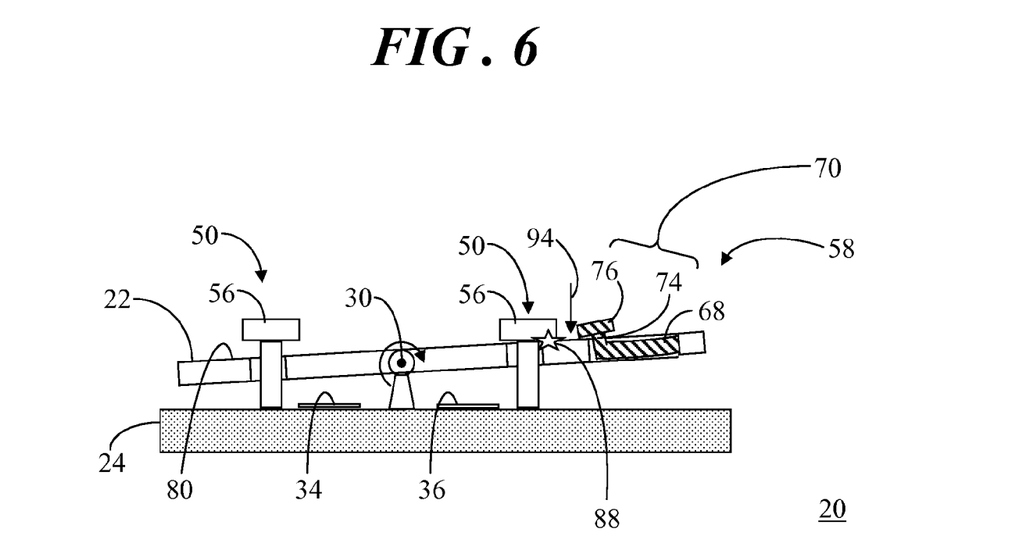
FIG. 6 shows a side view of the MEMS device in which the secondary structure impacts a movable element of the MEMS device.

FIG. 6 shows a side view of MEMS device 20 in which cap 76 of secondary structure 70 impacts the movable element, i.e., proof mass 22, of MEMS device 20. The condition illustrated in FIG. 6 approximately instantaneously follows the condition illustrated in FIG. 5. The rebound effect of spring 68 results in cap 76 impacting surface 80 of proof mass 22 with a force, represented by an arrow 94, in a direction that is likely to dislodge or move the potentially stuck proof mass 22 when it is struck by cap 76 of secondary structure 70. This direction may be opposite to the direction of mechanical shock 86. Thus, immediately following the impact of cap 76 against surface 80, proof mass 22 can return to its neutral position illustrated in FIG. 2.

Accordingly, secondary mass 70 of secondary structure 58 is adapted to impact proof mass 22 in response to the motion of proof mass 22 when proof mass 22 is subjected to a force, e.g., mechanical shock 86 (FIG. 4), that is considerably greater than the sensing range of MEMS device 20. Should MEMS device 20 sustain high z-axis acceleration, e.g., mechanical shock 86, the impact of secondary mass 70 against proof mass 22 will make sustained stiction less likely.

Figure 7:
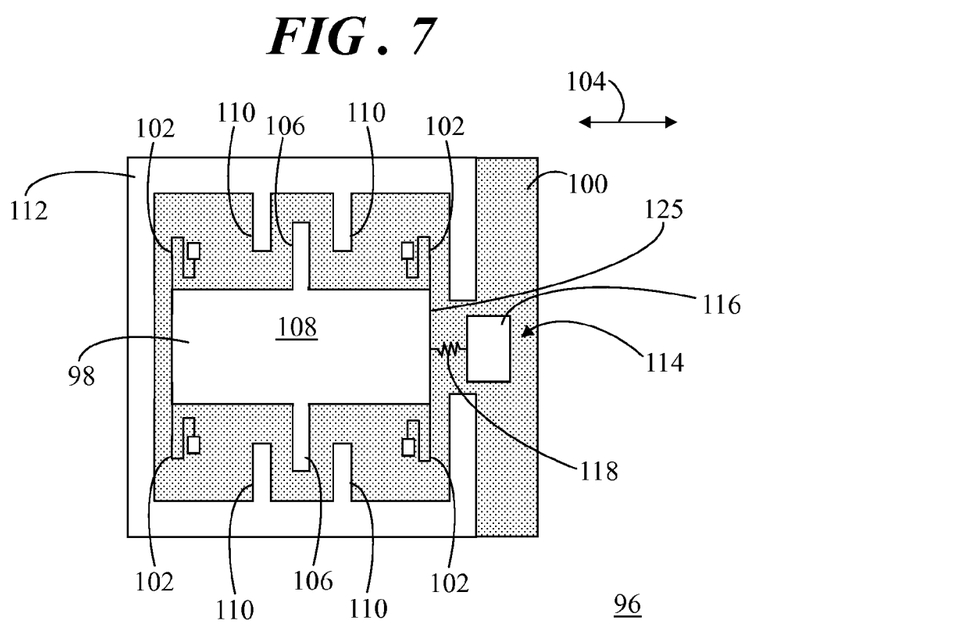
FIG. 7 shows a top view of a MEMS device in accordance with another embodiment.

FIG. 7 shows a top view of a MEMS device 96 in accordance with another embodiment. Previous discussion was directed to teeter-totter style sensors for detection of a physical condition perpendicular to a plane of the sensor. However, principles of the present invention need not be limited to z-axis sensors. Instead, the present invention can be readily adapted for sensors that detect a physical condition in a direction parallel to a plane of the sensor.

MEMS device 96 includes a movable element, in the form of a proof mass 98, suspended above a substrate 100 by one or more spring members 102. In an embodiment, spring members 102 are interconnected between proof mass 98 and substrate 100, and enable substantially linear motion of proof mass 98 relative to substrate 100. In this example, proof mass 98 with spring members 102 can move substantially parallel to substrate 100 in response to an x-axis acceleration, as represented by an arrow 104.

Proof mass 98 includes movable fingers 106 extending from a body 108 of proof mass 98. Each movable finger 106 is located between a pair of fixed fingers 110 that are fixed, or stationary, relative to substrate 100. The accelerometer structure of MEMS device 96 can measure distinct capacitances between each movable finger 106 and its corresponding pair of fixed fingers 110. These capacitances are a measure of an external physical condition such as x-axis acceleration 104. Although only two movable fingers 106 and two pairs of fixed fingers 110 are shown, those skilled in the art will readily recognize that MEMS device 96 can include any number of movable fingers 106 and fixed fingers 110 in accordance with particular design criteria.

MEMS device 96 may include a motion stop structure embodied as a fixed frame 112 coupled to and extending above substrate 100 that at least partially encircles proof mass 98. In addition, or alternatively, MEMS device 96 may include lateral motion stops (not shown) that extend through apertures in proof mass 98. The lateral motion stops may be similar in design to vertical motion stops 50 (FIG. 1), discussed above. Fixed frame 112 and/or lateral motion stops function to limit excessive movement of proof mass 98 in response to x-axis acceleration 104 that is greater than the sensing range for MEMS device 96.

A secondary structure 114 extends from proof mass 98 and is suspended above substrate 100. Secondary structure 114 includes a secondary mass 116 and a spring element 118 interconnected between proof mass 98 and secondary mass 116. Thus, secondary structure 114 is a projecting member that is supported only at one end, i.e., the interconnection of spring element 118 with proof mass 98. In an embodiment, spring element 118 may be a compression spring that exhibits a stiffness that is greater than a combined stiffness of spring members 102. In alternative embodiments, secondary structure 114 may include more than one spring element 118 interconnected between proof mass 98 and secondary mass 116 that collectively exhibit a stiffness that is greater than a combined stiffness of spring members 102.

In an embodiment, the collective spring stiffness of spring members 102, in concert with the weight of proof mass 98, enables spring members 102 to deflect in response to x-axis acceleration 104 within a particular sensing range, for example, between 0 and 8 g's, so that proof mass 98 moves laterally, i.e. parallel to the surface of substrate 100, and movable fingers 106 change position with respect to fixed fingers 110. However, due to its greater stiffness in concert with the weight of secondary mass 116, compression spring 118 is prevented from deflecting appreciably, i.e., compressing, within the particular sensing range of MEMS device 96. Accordingly, secondary structure 114 that includes secondary mass 116 and compression spring 118 does not change or affect the normal operation of MEMS device 20 under relatively low x-axis acceleration 104. Instead, compression spring 118 must be subjected to a significantly greater force, e.g., a mechanical shock, at levels of hundreds or thousands of g's before it will deflect appreciably. The operation of MEMS device 96, and particularly with respect to secondary structure 114, will be described in connection with the ensuing discussion of FIGS. 8 and 9.

Figure 8:
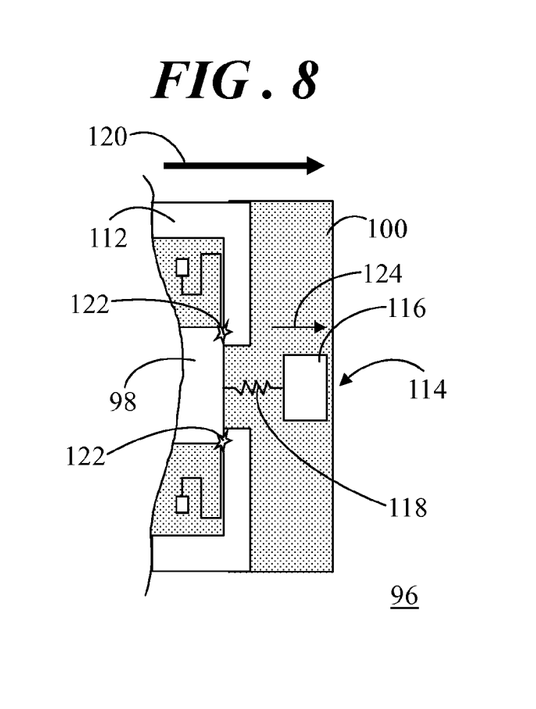
FIG. 8 shows a partial top view of the MEMS device of FIG. 7 subjected to mechanical shock.

FIG. 8 shows a partial top view of MEMS device 96 subjected to a mechanical shock 120, represented by a heavy arrow. Mechanical shock 120 is an x-axis acceleration 104 (FIG. 7) that is considerably greater than the sensing range of MEMS device 96. For example, mechanical shock 120 may be orders of magnitude greater than the sensing range of MEMS device 96. When subjected to mechanical shock 120, proof mass 98 will move substantially parallel to the surface of substrate 100 until proof mass 98 forcefully collides with a portion of fixed frame 112. Mechanical shock 120 applied to proof mass 98 is strong enough to use up the range of motion of proof mass 98 such that proof mass 98 stops against fixed frame 112. In the example presented in FIG. 8, the collision of proof mass 98 against fixed frame 112 is represented by star elements 122. That is, star elements 122 are not physical components of MEMS device 96, but rather star elements 122 are used to represent a forceful contact or collision of proof mass 98 with fixed frame 112 that could potentially cause physical damage to MEMS device 96.

When a conventional MEMS device that does not include secondary structure 114 is subjected to, for example, mechanical shock 120, any additional force from mechanical shock 120 placed against fixed frame 112 from proof mass 98 can result in a stiction event in which proof mass 98 is temporarily or permanently adhered to fixed frame 112, or alternatively, fixed frame 112 and/or proof mass 98 may break or be otherwise damaged. With the inclusion of secondary structure 114 in MEMS device 96, the additional force from mechanical shock 120 beyond what is needed to push proof mass 98 against fixed frame 112 is instead used to push secondary mass 116 into a state ready for recoil. That is, as shown in FIG. 8, compression spring stretches, as represented by a rightward pointing arrow 124, such that secondary mass 116 springs laterally outwardly away from proof mass 98.

Figure 9:
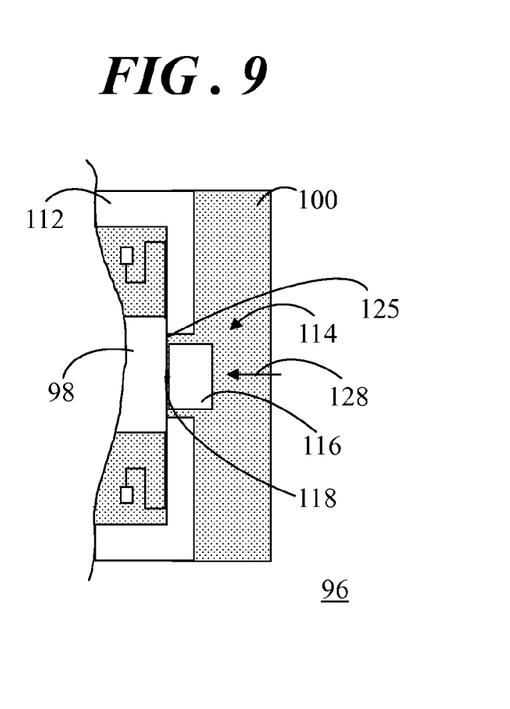
FIG. 9 shows a partial top view of the MEMS device of FIG. 7 in which a secondary structure impacts a movable element of the MEMS device.

FIG. 9 shows a partial top view of MEMS device 96 in which secondary mass 116 of secondary structure 114 impacts proof mass 98. The condition illustrated in FIG. 9 approximately instantaneously follows the condition illustrated in FIG. 8. As represented in FIG. 9, compression spring 118 has used up its range of motion and springs back, i.e., rebounds, in the opposite direction relative to its initial movement. The rebound effect of compression spring 118 results in secondary mass 116 impacting an outer side edge 125 of proof mass 98 with a force, represented by a leftward pointing arrow 126, in a direction that is likely to dislodge or move the potentially stuck proof mass 98 when it is struck by secondary mass 116. This direction may be opposite to the direction of mechanical shock 120. Thus, immediately following the impact of secondary mass 116 against proof mass 98, proof mass 98 can return to its neutral position illustrated in FIG. 7.

Accordingly, secondary mass 116 of secondary structure 114 is adapted to impact proof mass 98 in response to the motion of proof mass 98 when proof mass 98 is subjected to a force, e.g., mechanical shock 120 (FIG. 8), that is considerably greater than the sensing range of MEMS device 96. Should MEMS device 96 sustain high x-axis acceleration, e.g., mechanical shock 120, the impact of secondary mass 116 against proof mass 98 will make sustained stiction less likely.

Figure 10:
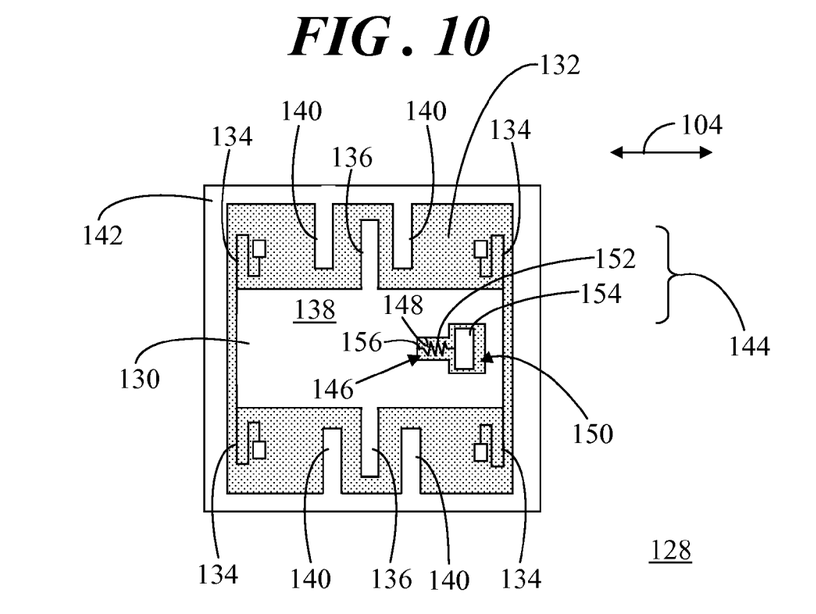
FIG. 10 shows a top view of a MEMS device in accordance with yet another embodiment.

FIG. 10 shows a top view of a MEMS device 128 in accordance with yet another embodiment. Like MEMS device 96 (FIG. 7), MEMS device 128 can detect a physical condition in a direction parallel to the plane of MEMS device 128. MEMS device 128 includes a movable element, in the form of a proof mass 130, suspended above a substrate 132 by one or more spring members 134. In an embodiment, spring members 134 are interconnected between proof mass 130 and substrate 132, and enable substantially linear motion of proof mass 130 relative to substrate 132. In this example, proof mass 130 with spring members 134 can move substantially parallel to substrate 132 in response to x-axis acceleration 104.

Proof mass 130 includes movable fingers 136 extending from a body 138 of proof mass 130. Each movable finger 136 is located between a pair of fixed fingers 140 that are fixed, or stationary, relative to substrate 132. The accelerometer structure of MEMS device 128 can measure distinct capacitances between each movable finger 136 and its corresponding pair of fixed fingers 140. These capacitances are a measure of an external physical condition such as x-axis acceleration 104. Although only two movable fingers 136 and two pairs of fixed fingers 140 are shown, those skilled in the art will readily recognize that MEMS device 128 can include any number of movable fingers 136 and fixed fingers 140 in accordance with particular design criteria.

MEMS device 128 may include a motion stop structure embodied as a fixed frame 142 coupled to and extending above substrate 132 that at least partially encircles proof mass 130. In addition, or alternatively, MEMS device 128 may include lateral motion stops (not shown) that extend through apertures in proof mass 130. Fixed frame 142 and/or the lateral motion stops function to limit excessive movement of proof mass 130 in response to x-axis acceleration 104 that is considerably greater than the sensing range for MEMS device 128.

In the embodiment of FIG. 10, a secondary structure 144 is coupled to proof mass 130 and is suspended above substrate 132. More particularly, proof mass 130 includes an aperture 146 extending through the thickness of proof mass 130 and defined by inner side walls 148. Secondary structure 144 resides in aperture 146 and is spaced apart from inner side walls 148 of proof mass 130 by a gap 150. Placement of secondary structure 144 within aperture 146 may achieve savings in terms of the overall size of MEMS device 128 relative to MEMS device 96.

Secondary structure 144 includes a spring element 152 and a secondary mass 154. Spring element 152 is positioned in aperture 146, and a first end 156 of spring element 152 is coupled to, i.e. formed to extend from, one of inner side walls 148 of proof mass 130. Thus, secondary structure 144 is a projecting member that is supported only at one end, i.e., the interconnection of spring element 152 with proof mass 130. In an embodiment, spring element 152 may be a compression spring that exhibits a stiffness that is greater than a combined stiffness of spring members 134.

Like MEMS devices 20 (FIGS. 1) and 96 (FIG. 7), the collective spring stiffness of spring members 134 in concert with the weight of proof mass 130 enables spring members 134 to deflect in response to acceleration, e.g., x-axis acceleration 104, within a particular sensing range, for example, between 0 and 8 g's, so that proof mass 130 moves laterally, i.e. parallel to the surface of substrate 132, and movable fingers 136 change position with respect to fixed fingers 140. However, due to its spring stiffness in concert with the weight of secondary mass 154, compression spring 152 is prevented from deflecting appreciably, i.e., compressing, within the particular sensing range of MEMS device 128. Accordingly, secondary structure 144 that includes secondary mass 154 and compression spring 152 does not change or affect the normal operation of MEMS device 128 under relatively low x-axis acceleration 104. Instead, compression spring 152 must be subjected to a significantly greater force, e.g., a mechanical shock, at levels of hundreds or thousands of g's before it will deflect appreciably. The operation of MEMS device 128, and particularly with respect to secondary structure 144, will be described in connection with the ensuing discussion of FIGS. 11 and 12.

Figure 11:
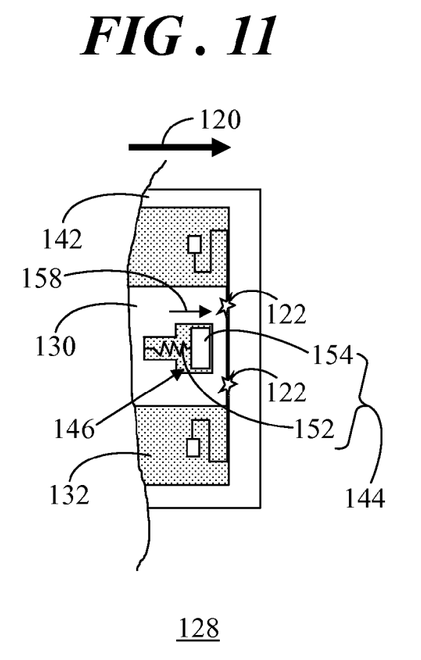
FIG. 11 shows a partial top view of the MEMS device of FIG. 11 subjected to mechanical shock.

FIG. 11 shows a partial top view of MEMS device 128 subjected to mechanical shock 120. Again, mechanical shock 120 is an x-axis acceleration 104 (FIG. 7) that is considerably greater than the sensing range of MEMS device 96. For example, mechanical shock 120 may be orders of magnitude greater than the sensing range of MEMS device 128. When subjected to mechanical shock 120, proof mass 130 will move substantially parallel to the surface of substrate 132 until proof mass 130 forcefully collides with a portion of fixed frame 142. Mechanical shock 120 applied to proof mass 130 is strong enough to use up the range of motion of proof mass 130 such that proof mass 130 stops against fixed frame 142. In the example presented in FIG. 11, the collision of proof mass 130 against fixed frame 142 is also represented by star elements 122. That is, star elements 122 are not a physical components of MEMS device 128, but rather star elements 122 are used to represent a forceful contact or collision of proof mass 130 with fixed frame 142 that could potentially cause physical damage to MEMS device 128.

With the inclusion of secondary structure 144 in MEMS device 128, the additional force from mechanical shock 120 beyond what is needed to push proof mass 130 against fixed frame 142 is instead used to push secondary mass 154 residing in aperture 146 into a state ready for recoil. That is, as shown in FIG. 11, compression spring 152 stretches, as represented by a rightward pointing arrow 158, such that secondary mass 154 springs laterally outwardly away from the attachment point of compression spring 152 to one of inner side walls 148.

Figure 12:
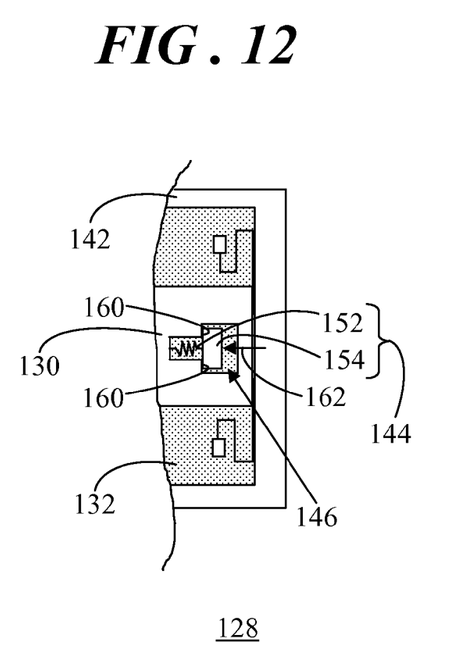
FIG. 12 shows a partial top view of the MEMS device of FIG. 11 in which a secondary structure impacts a movable element of the MEMS device.

FIG. 12 shows a partial top view of MEMS device 128 in which secondary mass 154 of secondary structure 144 impacts proof mass 130. The condition illustrated in FIG. 12 approximately instantaneously follows the condition illustrated in FIG. 11. As represented in FIG. 12, compression spring 152 residing in aperture 146 has used up its range of motion and springs back, i.e., rebounds, in the opposite direction relative to its initial movement. Aperture 146 is shaped such that one of inner side walls 148 forms an abutment edge 160. The rebound effect of compression spring 152 results in secondary mass 154 impacting abutment edge 160 of proof mass 130 with a force, as represented by a leftward pointing arrow 162, in a direction that is likely to dislodge or move the potentially stuck proof mass 130 when it is struck by secondary mass 154. Thus, immediately following the impact of secondary mass 154 against abutment edge 160, proof mass 130 can return to its neutral position illustrated in FIG. 10.

Accordingly, secondary mass 154 of secondary structure 144 is adapted to impact proof mass 130 in response to the motion of proof mass 130 when proof mass 130 is subjected to a force, e.g., mechanical shock 120 (FIG. 8), that is greater than the sensing range of MEMS device 128. Should MEMS device 128 sustain high x-axis acceleration, e.g., mechanical shock 120, the impact of secondary mass 154 against proof mass 130 will make sustained stiction less likely.

In summary embodiments of the invention entail microelectromechanical (MEMS) devices with enhanced resistance to damage from mechanical shock. In particular, embodiments entail a secondary structure extending from a suspended movable element, i.e., proof mass. The secondary structure includes a spring element adapted for movement in response to motion of the proof mass when the MEMS device is subjected to mechanical shock. This movement causes the secondary structure to impact the proof mass in a direction that would be likely to dislodge a potentially stuck proof mass. Furthermore, some of the energy from the mechanical shock may be absorbed by the spring element in order to limit or prevent breakage to internal structures of the MEMS device. Thus, a MEMS device that includes the secondary structure may be less likely to fail when subjected to mechanical shock, thereby enhancing long term device reliability.

Although the preferred embodiments of the invention have been illustrated and described in detail, it will be readily apparent to those skilled in the art that various modifications may be made therein without departing from the spirit of the invention or from the scope of the appended claims. For example, embodiments of the invention may be adapted to provide failure protection from mechanical shock to MEMS devices having two or more sense directions, such as a MEMS device capable of both a z-axis sense direction perpendicular to a plane of the sensor, and an x-axis and/or y-axis sense direction parallel to the plane of the sensor. Additionally, the types of spring element and the particular configuration of the mass structure can be varied from that which is shown herein. And in still other embodiments, a MEMS device may have more than one secondary structure in order to achieve an appropriately sufficient rebound effect.

What is claimed is:

1. A microelectromechanical systems (MEMS) device comprising:
    a substrate;
    a movable element suspended above said substrate and adapted for motion relative to said substrate; and
    a secondary structure coupled to said movable element and suspended above said substrate, said secondary structure being adapted to impact said movable element in response to said motion of said movable element.

2. A MEMS device as claimed in claim 1 wherein said secondary structure comprises:
    a secondary mass; and
    a spring element interconnected between said movable element and said secondary mass.

3. A MEMS device as claimed in claim 2 further comprising at least one spring member interconnected between said movable element and said substrate for enabling said motion of said movable element relative to said substrate, each of said at least one spring member being configured to undergo a first deflection amount in response to a unit of force, said spring element being configured to undergo a second deflection amount in response to said unit of force, said second deflection amount being less than said first deflection amount.

4. A MEMS device as claimed in claim 3 wherein a stiffness of said spring element is at least an order of magnitude greater than a collective stiffness of each of said at least one spring member such that said second deflection amount is less than said first deflection amount in response to said unit of force.

5. A MEMS device as claimed in claim 2 wherein a stiffness of said spring element substantially prevents movement of said secondary mass when said movable element is subjected to a force within a sensing range of said MEMS device.

6. A MEMS device as claimed in claim 2 wherein a stiffness of said spring element enables movement of said secondary mass into contact with said movable element when said movable element is subjected to a force that is greater than a sensing range of said MEMS device.

7. A MEMS device as claimed in claim 1 wherein said secondary structure comprises:
    a spring element having a first end and a second end, said first end being coupled to said movable element; and
    a secondary mass, said secondary mass including a stem coupled to said second end of said spring element and a cap coupled to said stem, said stem being oriented approximately perpendicular to a surface of said movable element, and said cap residing above said surface of said movable element such that a portion of said cap overlies said surface to yield a gap between said movable element and said cap of said secondary mass.

8. A MEMS device as claimed in claim 7 wherein:
    said movable element is adapted for said motion about a rotational axis interposed between first and second ends of said movable element;
    said movable element comprises a first section between said rotational axis and said first end of said movable element and a second section between said rotational axis and said second end of said movable element, said first section exhibits a first length between said rotational axis and said first end of said movable element, said second section exhibits a second length between said rotational axis and said second end of said movable element, said second length being greater than said first length, said spring element being coupled to said second section of said movable element; and
    said spring element is configured to enable movement of said cap approximately perpendicular to said surface of said movable element in response to said motion about said rotational axis.

9. A MEMS device as claimed in claim 1 wherein said motion of said movable element is lateral motion, and said secondary structure comprises:
    a spring element having a first end coupled to an outer side edge of said movable element; and
    a secondary mass coupled to a second end of said spring element, said secondary mass being spaced apart from said movable element by a gap, said secondary mass being adapted to impact said outer side edge of said movable element in response to said lateral motion of said movable element.

10. A MEMS device as claimed in claim 1 wherein said movable element includes an aperture extending through a thickness of said movable element and said secondary structure resides in said aperture.

11. A MEMS device as claimed in claim 10 wherein said aperture is defined by inner side walls of said movable element and said secondary structure comprises:
    a spring element positioned in said aperture, a first end of said spring element being coupled to one of said inner side walls of said movable element; and
    a secondary mass positioned in said aperture and coupled to a second end of said spring element, said secondary mass being spaced apart from said movable element by a gap.

12. A MEMS device as claimed in claim 11 wherein said motion of said movable element is lateral motion, and said aperture is shaped such that one of said inner side walls forms an abutment edge, said secondary mass being adapted to impact said abutment edge in response to said lateral motion of said movable element.

13. A MEMS device as claimed in claim 1 further comprising at least one motion stop coupled to said substrate proximate to said movable element, wherein said movable element contacts said motion stop in response to a force greater than a sensing range of said MEMS device and said secondary structure is adapted to impact said movable element in response to said force to substantially prevent adhesion of said movable element to said motion stop.

14. A microelectromechanical systems (MEMS) device comprising:
    a substrate;

a movable element suspended above said substrate and adapted for motion relative to said substrate; and a secondary structure coupled to said movable element and suspended above said substrate, said secondary structure including a secondary mass and at least one spring element interconnected between said movable element and said secondary mass, said at least one spring element exhibits a stiffness, and said stiffness of said at least one spring element enables said secondary mass to impact said movable element when said movable element is subjected to a first force that is greater than a first acceleration sensing range of said MEMS device, and said stiffness of said at least one spring element substantially prevents movement of said secondary mass into contact with said movable element when said movable element is subjected to a second force within said first acceleration sensing range of said MEMS device, wherein said movable element moves relative to said substrate in response to said first and second forces.

15. A MEMS device as claimed in claim 14 wherein said secondary mass comprises:

a stem coupled to an end of said spring element and oriented approximately perpendicular to a surface of said movable element; and a cap coupled to said stem and residing above said surface of said movable element such that a portion of said cap overlies said surface to yield a gap between said movable element and said cap of said secondary mass.

16. A MEMS device as claimed in claim 15 wherein:

said movable element is adapted for said motion about a rotational axis interposed between first and second ends of said movable element;

said movable element comprises a first section between said rotational axis and said first end and a second section between said rotational axis and said second end, said first section exhibits a first length between said rotational axis and said first end, said second section exhibits a second length between said rotational axis and said second end, said second length being greater than said first length, said spring element being coupled to said second section of said movable element; and said spring element is configured to enable movement of said cap approximately perpendicular to said surface of said movable element when said movable element is subjected to said first force.

17. A MEMS device as claimed in claim 14 wherein:

an end of said spring element is coupled to an outer side edge of said movable element; and said secondary mass is spaced apart from said movable element by a gap, said secondary mass being adapted to impact said outer side edge of said movable element when said movable element is subjected to said first force.

18. A MEMS device as claimed in claim 14 wherein:

said movable element includes an aperture extending through a thickness of said movable element, said aperture being defined by inner side walls of said movable element;

said spring element is positioned in said aperture, a first end of said spring element being coupled to one of said inner side walls of said movable element; and said secondary mass is positioned in said aperture and coupled to a second end of said spring element, said secondary mass being spaced apart from said movable element by a gap, said aperture being shaped such that one of said inner side walls forms an abutment edge, and said secondary mass being adapted to impact said abutment edge when said movable element is subjected to said first force.

19. A microelectromechanical systems (MEMS) device comprising:

a substrate;

a movable element suspended above said substrate and adapted for motion relative to said substrate, said movable element including an aperture extending through a thickness of said movable element; and a secondary structure coupled to said movable element and residing in said aperture, said secondary structure including a secondary mass and at least one spring element interconnected between said movable element and said secondary mass, said secondary mass being adapted to impact said movable element when said movable element is subjected to a force that is greater than a first acceleration sensing range of said MEMS device.

20. A MEMS device as claimed in claim 19 further comprising at least one spring member interconnected between said movable element and said substrate for enabling said motion of said movable element relative to said substrate, each of said at least one spring member being configured to undergo a first deflection amount in response to a unit of force, said at least one spring element being configured to undergo a second deflection amount in response to said unit of force, said second deflection amount being less than said first deflection amount.

* * * * *